United States Patent
Cho et al.

(10) Patent No.: US 11,328,783 B2
(45) Date of Patent: May 10, 2022

(54) SEMICONDUCTOR DEVICE HAVING A DIODE TYPE ELECTRICAL FUSE (E-FUSE) CELL ARRAY

(71) Applicant: KEY FOUNDRY CO., LTD., Cheongju-si (KR)

(72) Inventors: Jong Min Cho, Cheongju-si (KR); Sung Bum Park, Seongnam-si (KR); Kee Sik Ahn, Hwaseong-si (KR); Seong Jun Park, Suwon-si (KR)

(73) Assignee: KEY FOUNDRY CO., LTD., Cheongju-si (KR)

( * ) Notice: Subject to any disclaimer, the term of this patent is extended or adjusted under 35 U.S.C. 154(b) by 0 days.

(21) Appl. No.: 17/237,907

(22) Filed: Apr. 22, 2021

(65) Prior Publication Data

US 2021/0241841 A1 Aug. 5, 2021

Related U.S. Application Data

(62) Division of application No. 16/848,913, filed on Apr. 15, 2020, now Pat. No. 11,024,398.

(30) Foreign Application Priority Data

Oct. 29, 2019 (KR) .......... 10-2019-0135398

(51) Int. Cl.
*H01L 23/58* (2006.01)
*G11C 17/16* (2006.01)
(Continued)

(52) U.S. Cl.
CPC .............. *G11C 17/16* (2013.01); *G11C 17/18* (2013.01); *H01L 23/585* (2013.01); *H01L 27/11206* (2013.01)

(58) Field of Classification Search
CPC ...................................... H01L 23/58
(Continued)

(56) References Cited

U.S. PATENT DOCUMENTS 4,287,569 A 9/1981 Fukushima
4,603,404 A 7/1986 Yamauchi et al.
(Continued)

FOREIGN PATENT DOCUMENTS

KR 10-2012-0052440 A 5/2012
KR 10-2013-0090714 A 8/2013
(Continued)

OTHER PUBLICATIONS

Korean Office Action dated Sep. 27, 2021 in counterpart Korean Patent Application No. 10-2020-0074807 (6 pages in Korean).
(Continued)

*Primary Examiner* — Muna A Techane
(74) *Attorney, Agent, or Firm* — NSIP Law

(57) ABSTRACT

A semiconductor device includes a first word line configured to perform a writing operation or a programing operation, a second word line configured to perform a read operation, a first switching device including a first gate electrode and a first node, a second switching device comprising a second gate electrode and a second node, an electrical fuse (e-fuse) disposed between the first node and the second node, and a diode coupled to the first node and the first word line, wherein the first gate electrode and the second gate electrode are coupled to the second word line.

10 Claims, 10 Drawing Sheets

(51) Int. Cl.
  *H01L 27/112* (2006.01)
  *G11C 17/18* (2006.01)
(58) Field of Classification Search
  USPC .......................................................... 365/96
  See application file for complete search history.

(56) References Cited

U.S. PATENT DOCUMENTS

| | | | |
|---|---|---|---|
| 4,638,466 A | 1/1987 | Fukumoto | |
| 4,654,688 A | 3/1987 | Fukushima | |
| 4,881,114 A | 11/1989 | Mohsen et al. | |
| 6,199,177 B1 | 3/2001 | Blodgett | |
| 6,525,953 B1 | 2/2003 | Johnson | |
| 7,817,455 B2 | 10/2010 | Fredeman et al. | |
| 8,331,126 B2* | 12/2012 | Terzioglu | G11C 17/16 365/96 |
| 8,514,606 B2 | 8/2013 | Chung | |
| 8,760,904 B2 | 6/2014 | Chung | |
| 8,913,415 B2 | 12/2014 | Chung | |
| 9,053,889 B2 | 6/2015 | Kirihata et al. | |
| 9,082,475 B2 | 7/2015 | Kim | |
| 9,437,274 B1 | 9/2016 | Kim et al. | |
| 9,805,818 B2 | 10/2017 | Kim et al. | |
| 9,830,996 B2 | 11/2017 | Yang | |
| 10,199,118 B2 | 2/2019 | Lee et al. | |
| 10,249,379 B2 | 4/2019 | Chung | |
| 2003/0107917 A1* | 6/2003 | Eaton, Jr. | G11C 11/1659 365/175 |
| 2008/0251884 A1* | 10/2008 | Chung | G11C 17/16 257/529 |
| 2008/0315354 A1 | 12/2008 | Ahn | |
| 2010/0213529 A1 | 8/2010 | Rolandi et al. | |
| 2012/0039107 A1 | 2/2012 | Chung | |
| 2012/0209888 A1 | 8/2012 | Chung | |
| 2013/0051113 A1 | 2/2013 | Kwon | |
| 2013/0083591 A1* | 4/2013 | Wuu | G11C 8/12 365/154 |
| 2013/0201773 A1 | 8/2013 | Kim | |
| 2013/0215663 A1 | 8/2013 | Chung | |
| 2014/0010005 A1 | 1/2014 | Redaelli | |
| 2015/0310930 A1 | 10/2015 | Boldt et al. | |
| 2017/0125120 A1 | 5/2017 | Yang | |
| 2017/0352432 A1 | 12/2017 | Tu | |
| 2018/0005703 A1 | 1/2018 | Chung | |
| 2018/0108425 A1 | 4/2018 | Lee et al. | |
| 2019/0130985 A1 | 5/2019 | Kim | |
| 2019/0139892 A1* | 5/2019 | Wong | H01L 23/528 |
| 2019/0371406 A1 | 12/2019 | Yang et al. | |

FOREIGN PATENT DOCUMENTS

| | | |
|---|---|---|
| KR | 10-2018-0041427 A | 4/2018 |
| KR | 10-2020-0057658 A | 5/2020 |

OTHER PUBLICATIONS

Korean Office Action dated Jan. 26, 2021 in counterpart Korean Patent Application No. 10-2019-0135398 (6 pages in Korean).
United States Office Action dated Apr. 15, 2021 in related U.S. Appl. No. 16/993,380 (11 pages in English).
Korean Office Action dated May 13, 2021 in corresponding Korean Patent Application No. 10-2021-0037352 (7 pages in Korean).

* cited by examiner

SEMICONDUCTOR DEVICE HAVING A DIODE TYPE ELECTRICAL FUSE (E-FUSE) CELL ARRAY

CROSS-REFERENCE TO RELATED APPLICATIONS

This application is a division of U.S. patent application Ser. No. 16/848,913 filed on Apr. 15, 2020, which claims the benefit under 35 U.S.C. 119(a) of Korean Patent Application No. 10-2019-0135398 filed on Oct. 29, 2019 in the Korean Intellectual Property Office, the entire disclosure of which is incorporated herein by reference for all purposes.

BACKGROUND

1. Field

The following description relates to an electrical-fuse (e-fuse) cell. The following description also relates to a nonvolatile memory device provided with such an e-fuse cell.

2. Description of Related Art

Typically, power integrated circuits (ICs) such as Power Management IC (PMIC) devices may require a small capacity of using nonvolatile One Time Programmable (OTP) memory to perform analog trimming functions. However, typical OTP memories, using an E-Memory or transistor as a nonvolatile memory, may present issues of a complicated driving method, a low reliability and a large area.

Therefore, for the nonvolatile OTP memory, an electrical-fuse One-Time Programmable (e-fuse OTP) memory having a simple driving method and a small area may be used in typical examples. Such an e-fuse type memory may be programmed by opening an e-fuse by blowing the e-fuse using an overcurrent of about 10 mA to 30 mA in a polysilicon fuse or a metal fuse, which are examples of fuses used as the e-fuse. The resistance before the program operation is about 50-100Ω, and as the program current flows through the e-fuse, e-fuse resistance after the program is more than such a few tens of Ωs of resistance.

In order to blow such an e-fuse, as noted above, a program current of 10 to 30 mA may be required, and a metal-oxide-semiconductor (MOS) transistor having a channel width of a predetermined value or more may be required to flow such a program current of a predetermined value or more, thereby increasing the area of the e-fuse memory cell.

Not being able to reduce the area of a memory device, as described above, means the size of the memory device may not readily be reduced, which may be an issue in designing a miniaturized memory device.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device, includes a first word line configured to perform a writing operation or a programing operation, a second word line configured to perform a read operation, a first switching device including a first gate electrode and a first node, a second switching device including a second gate electrode and a second node, an electrical fuse (e-fuse) disposed between the first node and the second node, and a diode coupled to the first node and the first word line, wherein the first gate electrode and the second gate electrode are coupled to the second word line.

The semiconductor device may further include a first bit line coupled to the second node and a third switching device, wherein the first switching device and the second switching device each may include an N-type metal-oxide-semiconductor (NMOS) transistor, and the third switching device may include a P-type metal-oxide-semiconductor (PMOS) transistor.

A program current may pass through the first bit line, the second node, the e-fuse, the first node, the diode and the first word line, in that order.

A read current may pass through the first switching device, the first node, the e-fuse, the second node and the second switching device, in that order.

A current path for the programing operation in the e-fuse may have a direction opposite to a direction for a current path for the read operation in the e-fuse.

The semiconductor device may further include a program current controller configured to provide a program voltage to a selected e-fuse cell for the program operation, a read current control controller configured to provide a read voltage to the selected e-fuse cell for the read operation, a reference voltage generator configured to generate a reference voltage, and a sensor, including a sense amplifier, configured to sense whether the selected e-fuse cell is programmed or not.

The read current controller may include a read current switching device and a read current resistor connected in series.

The reference voltage generator may include first, second and third reference switching devices, and first and second reference resistors, wherein each of the read current switching device and the first reference switching device may include a P-type metal-oxide-semiconductor (PMOS) transistor.

In another general aspect, a semiconductor device includes an e-fuse formed on an insulation layer, a first switching device formed on a first well region, a diode formed on a second well region having a opposite conductivity type to a conductivity type of the first well region, and a second switching device formed on a third well region having a same conductivity type as the conductivity type of the first well region.

The semiconductor device may further include a guard ring that may enclose the first switching device, the diode, the e-fuse and the second switching device.

The first switching device and the second switching device may be n-type metal-oxide-semiconductor (NMOS) transistors.

The semiconductor device may further include a first contact plug formed on the first switching device, a second contact plug formed on the diode, a third contact plug and a fourth contact plug formed on the e-fuse, and a fifth contact plug formed on the second switching device.

The semiconductor device may further include a first metal interconnection connecting the first contact plug, the second contact plug and the third contact plug, and a second metal interconnection connecting the fourth contact plug and the fifth contact plug.

In another general aspect, a semiconductor device includes an e-fuse formed on an insulation layer, a first switching device formed on a first well region, a diode formed on a second well region, and a second switching device formed on a third well region.

The second well region may have an opposite conductivity type to a conductivity type of the first well region.

The third well region may have a same conductivity type as a conductivity type of the first well region.

The semiconductor device may further include a guard ring that encloses the first switching device, the diode, the e-fuse and the second switching device.

The first switching device and the second switching device may be n-type metal-oxide-semiconductor (NMOS) transistors.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
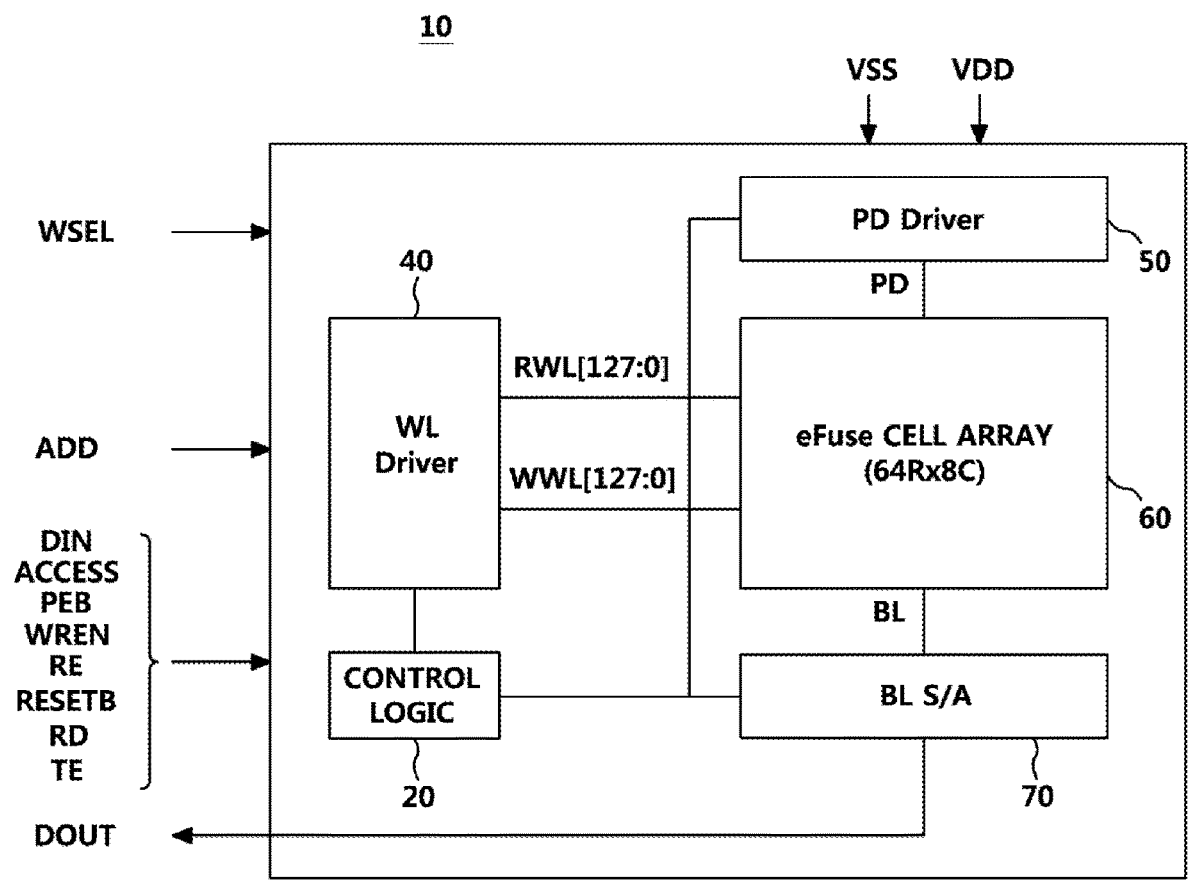
FIG. 1 illustrates a block diagram of a nonvolatile memory device having an e-fuse cell array, according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

One or more examples may provide an e-fuse cell capable of operating stably with a lower current, while reducing the area compared to the related art by improving the arrangement of circuit devices constituting the e-fuse cell, and a nonvolatile memory device provided with such an e-fuse cell.

Also, one or more examples may provide a nonvolatile memory device having an e-fuse cell that reduces the area of a memory device by arranging the devices of the e-fuse cell appropriately, and the nonvolatile memory device may have a different current flow used for a program mode and a read mode operation for storing and reading data, thereby allowing for stable operation with a lower current. The following description is described below based on examples illustrated in drawings.

Accordingly, the following examples may provide for an e-fuse cell that may reduce the area of a memory cell by more appropriately arranging the devices constituting the e-fuse cell, and a nonvolatile device having such an e-fuse cell.

Such one or more examples are made possible by using a diode as a program selection device instead of a typical transistor device, and thus, even if the junction area is small, it may be possible to flow a current of a predetermined magnitude or more while still being able to reduce the area of the e-fuse cell.

In another aspect, the following description may provide for a nonvolatile memory device that has a different current path in the program mode and read mode operation, so as to be able to operate stably with a lower voltage so as to be able to operate at a lower current, accordingly.

FIG. 1 illustrates a block diagram of a nonvolatile memory device having an e-fuse cell array, according to an example.

As shown in the example of FIG. 1, a semiconductor device according to an example may include a nonvolatile memory (NVM) device 10. The nonvolatile memory (NVM) device may include a control logic 20, a word line (WL) driver 40, a programming driver 50, an e-fuse cell array 60, as a non-limiting example, though other elements may be present in addition to or instead of these enumerated elements. The control logic 20 may supply an internal control signal suitable for the program mode or the read mode, according to the control signal. The control logic 20 may supply a control signal into a word line (WL) driver 40 and a programming driver 50. The control logic 20 may also supply a control signal into the sense amplifier 70, which may also be a sensor 70 or be a part of a sensor 70. The word line (WL) driver 40 may include the word line selector, and may activate a write or programming word line (WWL) or a read word line (RWL), accordingly. The programming driver 50 may include the bit line selector, and supplies a programming current that is controlled by WSEL pins. The e-fuse cell array 60 may include a plurality of e-fuse unit cells 100. The sense amplifier (BL S/A) 70 may detect the digital data coming from the bit line (BL), and the data may be output through the OUTPUT (DOUT).

Further, RE, WREN and PEB ports denote Read Enable, Write Enable and Programming Enable, respectively. An ADD port may provide for address selection in the word line (WL) driver 40 to activate the write or programming word line (WWL) or the read word line (RWL). The WSEL port may provide for a programming current control in the programming driver 50 in order to supply the programming current. VDD and VSS ports may supply external supply power and ground voltage, respectively.

Although the cell array form or the capacity of the e-fuse cell array 60 may not be particularly limited to the particular one or more examples, one or more example are described with respect to an example of a predetermined capacity, arranged in 128 rows×16 columns. In such an example, the one row may correspond to one of write word lines (WWL) for a writing operation, and to one of read word lines (RWL) for a read operation. For example, there may be a one-to-one correspondence between the WWL and the RWL. For example, the e-fuse cell array 60 may include 128 word lines and 16 bit lines. Thus, a total of 2048 bits may be included in the e-fuse cell array 60, such that a total of 2048 e-fuse unit cells may be arranged in the e-fuse cell array 60. In such an example, the word line selector and the bit line selector are required to perform programming of the e-fuse unit cells. One of the 128 word lines and one of the 16 bit lines are serially selected through row decoding and column decoding. Thus, the e-fuse unit cell structure 100 is to be sequentially selected and operated.

Figure 2:
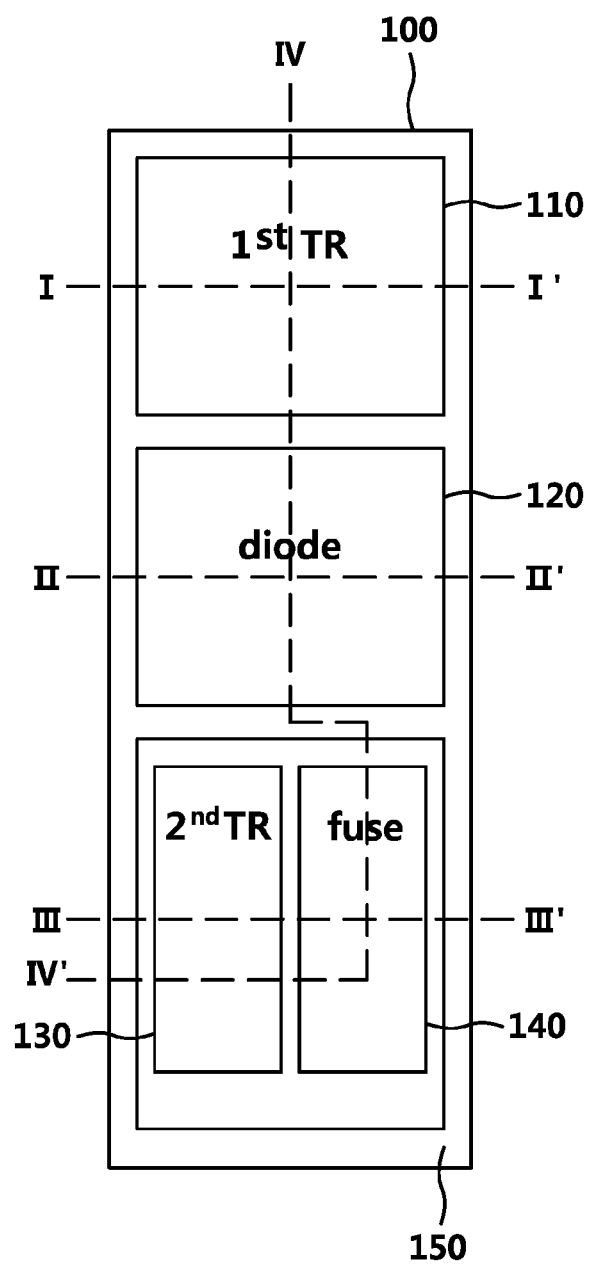
FIG. 2 illustrates a cell layout of the e-fuse unit cell structure disposed in the e-fuse cell array, according to an example.

FIG. 2 illustrates an e-fuse unit cell layout disposed in the e-fuse cell array, according to an example.

As illustrated in the example of FIG. 2, the e-fuse unit cell structure 100 may include a first switching device 110, a diode 120, a second switching device 130 and an e-fuse 140, as a non-limiting example, though other elements may be present in addition to or instead of these enumerated elements. The e-fuse 140 may be disposed to be adjacent to the second switching device 130 rather than the first switching device 110. The diode 120 may be located in a center region of the e-fuse unit cell structure 100. The guard ring 150 may be formed so as to enclose the first switching device 110, the diode 120, the second switching device 130 and the e-fuse 140. The two switching devices 110 and 130 may be n-type metal-oxide-semiconductor (NMOS) transistors or NMOS metal-oxide-semiconductor field effect transistors (MOSFETs). The cross-sections of each device are illustrated in the examples of FIGS. 6-10. The e-fuse unit cell structure 100 may be disposed side-by-side repeatedly, to make total 2048 e-fuse unit cells to be arranged in the e-fuse cell array 60.

Figure 3:
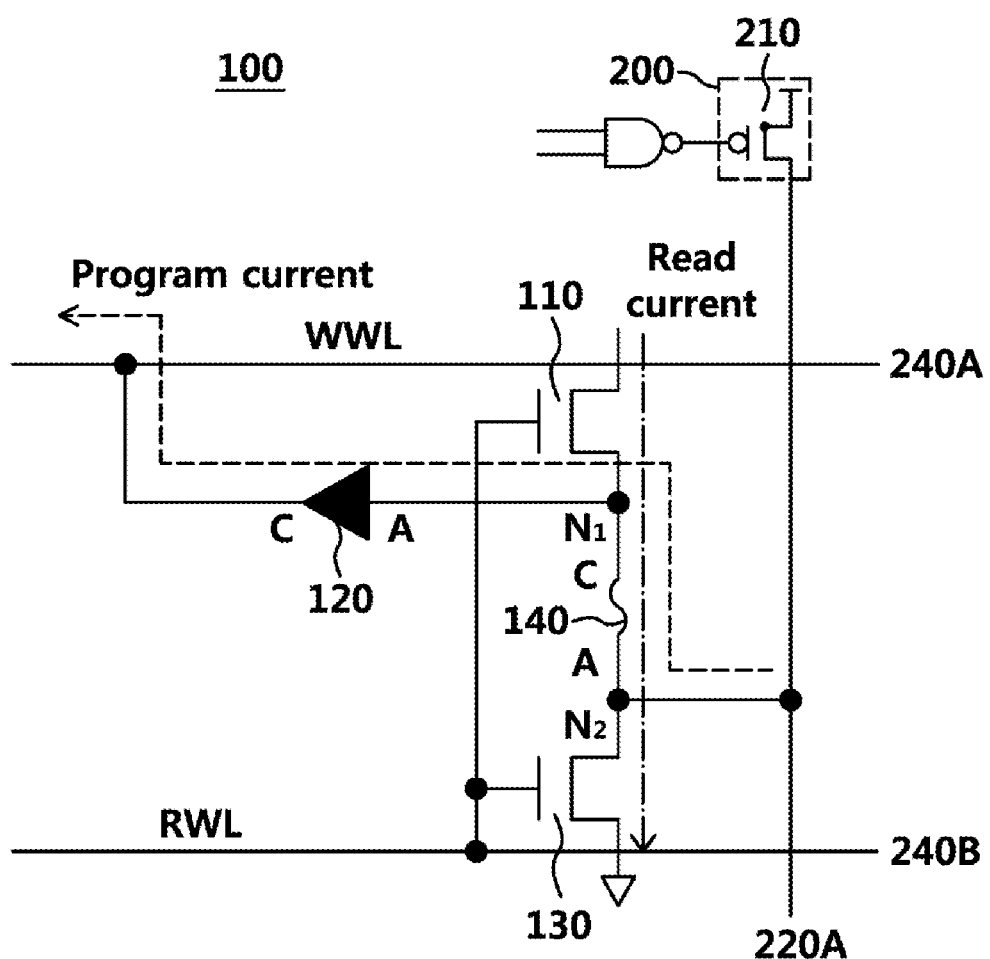
FIG. 3 illustrates a circuit diagram illustrating a connection structure of each device of the e-fuse cell, according to an example.

FIG. 3 is a circuit diagram illustrating a connection structure of devices disposed in the e-fuse unit cell structure 100.

According to the example of FIG. 3, the e-fuse unit cell structure 100 may include a first word line 240A used for a writing operation or a programing operation, a second word line 240B used for a read operation, a first switching device 110 having a first gate electrode and a first node N1, a second switching device 130 having a second gate electrode and a second node N2, an electrical fuse (e-fuse) 140 disposed between the first node N1 and the second node N2, a diode 120 coupled to the first node N1 and the first word line 240A, and a first bit line 220A coupled to the second node N2, as a non-limiting example, though other elements may be present in addition to or instead of these enumerated elements. The first gate electrode and the second gate electrode may be coupled to the second word line 240B. The first bit line 220A may be coupled to a third switching device 210 disposed in a program current control unit or program current controller 200. The first switching device 110 and the second switching device 130 may be NMOS transistors and the third switching device 210 may be a p-type metal-oxide-semiconductor (PMOS) transistor, according to an example. The first node N1 may be disposed between the first switching device 110 and the e-fuse 140. The second node N2 may be disposed between the second switching device 130 and the e-fuse 140.

According to the example of FIG. 3, the first switching device 110 and the second switching device 130 may be connected in series. The first switching device 110 may have a first source terminal, a first drain terminal and a first gate terminal, according to a non-limiting example. The first source terminal of the first switching device 110 near to the first node N1 may be connected to a cathode of the e-fuse 140.

The second switching device 130 may have a second source terminal, a second drain terminal and a second gate terminal, according to a non-limiting example. The second drain terminal near to the second node N2 may be connected to an anode of the e-fuse 140. A second source terminal may be connected to a ground terminal.

According to the example of FIG. 3, the e-fuse 140 may have a cathode C and an anode A, and the e-fuse 140 may be configured to be programmed by applying a programming current. The e-fuse 140 is disposed between the first switching device 110 and the second switching device 130, wherein the e-fuse comprises the anode or P terminal and the cathode or N terminal. The cathode or N terminal may be connected to the first source terminal of the first switching device 110 through the first node N1. The anode or P terminal of the e-fuse 140 may be connected to the second drain terminal of the second switching device 130 through the second node N2.

According to the example of FIG. 3, the diode 120 may include an anode or P terminal and a cathode or N terminal. The diode 120 may be disposed between the first node N1 and the first word line 240A. The anode of the diode 120 may be connected to the first node N1. The cathode of the diode 120 may be connected to the first word line 240A or write word line WWL, which is connected to the word line (WL) driver 40, and finally to the control logic 20.

As shown in the example of FIG. 3, a dashed line may denote a program current path for the e-fuse unit cell structure 100. The bit line 220 may supply the program current, and the e-fuse 140 may be programmed by the program current. The program current may thus flow out from the bit line and the e-fuse, through the diode 120 and write word line WWL. In such an example, the program current may flow from the anode of the e-fuse 140 into the cathode of the e-fuse 140.

According to the example of FIG. 3, a dash and dot line, including dashes separated by dots, may represent a read current path from the first switching transistor 110 to the second switching transistor 130. Accordingly, such a read current path may pass through the first switching transistor 110, the e-fuse 140 and the second switching transistor 130, as shown in the example of FIG. 3. In such an example, the read current may flow through the cathode of the e-fuse 140 into the anode of the e-fuse 140, which has an opposite current flow compared to the program current path. No read current may pass through the diode 120, so a high driving voltage may not be used. Therefore, using a read current with a low driving current may be possible. The read current may check whether the e-fuse is programmed or not. The voltage conditions are described in greater detail in another section of the present disclosure.

Figure 4:
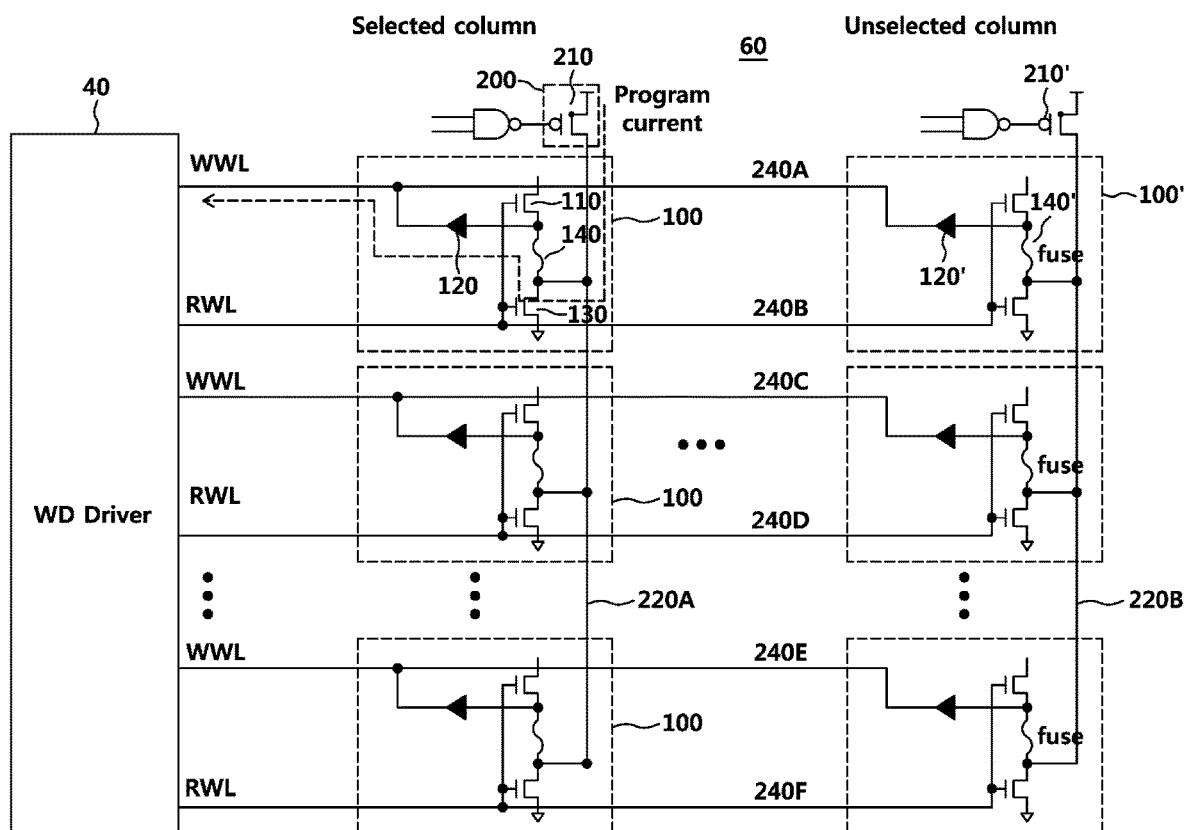
FIG. 4 illustrates a circuit diagram illustrating a program operation of a nonvolatile memory device, according to an example.

FIG. 4 illustrates a circuit diagram illustrating a program operation of a nonvolatile memory device, according to an example.

According to the example of FIG. 4, a programmable e-fuse cell array 60 may include a plurality of word lines 240A, 240B, 240C, 240D, 240E and 240F, and a plurality of bit lines 220A and 220B, as a non-limiting example. However, other examples may use a different number of word lines and/or bit lines. A first diode 120 may be coupled to the first word line 240A, and a first e-fuse 140 may be coupled to the first bit line 220A. A second diode 120' may also be coupled to the first word line 240A, and a second e-fuse 140' is coupled to a second bit line 220B. Another diode below the first diode 120 may also be coupled to second word line 240C, and another e-fuse below the second e-fuse 140' may also be coupled to the second bit line 220B. One of the write word lines 240A, 240C and 240E may be selectively activated by the word line selector disposed in the WL driver 40. One of the bit lines 220A and 220B may be selectively activated by the bit line selector disposed in the PD driver 50.

According to the example of FIG. 4, the e-fuse cell array 60 may further include a program current controller 200 having the third switching device 210. The program current controller 200 may control a programming current used to program the e-fuse 140. The programming current may be provided into the e-fuse by turning on the third switching device 210. For example, a PMOS transistor may be used for the third switching device 210. The third switching transistor 210 may include a third source terminal, a third drain terminal and a third gate terminal, according to a non-limiting example.

According to the example of FIG. 4, the first e-fuse unit cell 100 may be electrically isolated from the neighboring second e-fuse unit cell 100' by an trench isolation region 160 or another field oxide, which may reduce a leakage current otherwise occurring between the e-fuse unit cells 100 and 100'. The first e-fuse unit cell 100 and the second e-fuse unit cell 100' may be disposed in a first well region and a second well region, respectively, wherein the first well region may be isolated from the second well region by the trench isolation region 160. The e-fuse 140 may be a polysilicon fuse, also referred to as poly fuse, including a silicide layer formed on the poly-Si layer, where the silicide layer is selected from one of cobalt silicide, nickel silicide or titanium silicide, as non-limiting examples. A resistance of the e-fuse may be changed by the programming current. For example, a resistance of the e-fuse may have a resistance value of approximately 300Ω or less before a writing or programming operation, and may have a resistance value of approximately 3 kΩ or more after the writing or programming operation. A silicide layer may be rearranged, such as to have a migration on the poly-Si layer due to the applied programming current, and then the poly-Si's resistance may increase up to 3 kΩ because the silicide layer is moved to a local area in the poly-Si layer.

FIG. 4 shows a program operation of the nonvolatile memory device 10. The first e-fuse unit cell 100 may be selected for programing operation through a selection signal provided from the control logic 20. Then, the third switching device 210 may be turned on, and the first switching device 110 and the second switching device 130 may be turned off. As the third switching device 210 is turned on, a program voltage may be applied to the first bit line 220A, the program voltage approximately ranging from 3V to 8V. The first bit line 220A may be connected to the second node N2. During the program operation of the nonvolatile memory device 10, a program voltage may be selectively provided to the e-fuse unit cell structure 100 through the first bit line 220. The first bit line 220 may be selected through column decoding, in such an example. A program current may flow through the third switching device 210, the first bit line 220A, the first e-fuse 140, and the first diode 120. Accordingly, a high current may flow through the e-fuse 140 so that information is programmed. The programmed e-fuse 140 may have a high resistance of approximately 3 k$\Omega$ or more.

If the second e-fuse unit cell 100' is unselected during the programing operation, the second diode 120' in the unselected e-fuse unit cell 100' may serve as a protection device when the cell 100' is not being written. For example, a voltage of 5V may be applied to write the first bit line 220A, and a voltage of 1V may be applied to write a second bit line 220B. The second diode 120' in the second e-fuse unit cell 100' may block a current flowing from the shared first word line 240A through the first e-fuse unit cell 100. The unselected second e-fuse cell 100' may be therefore protected.

Figure 5:
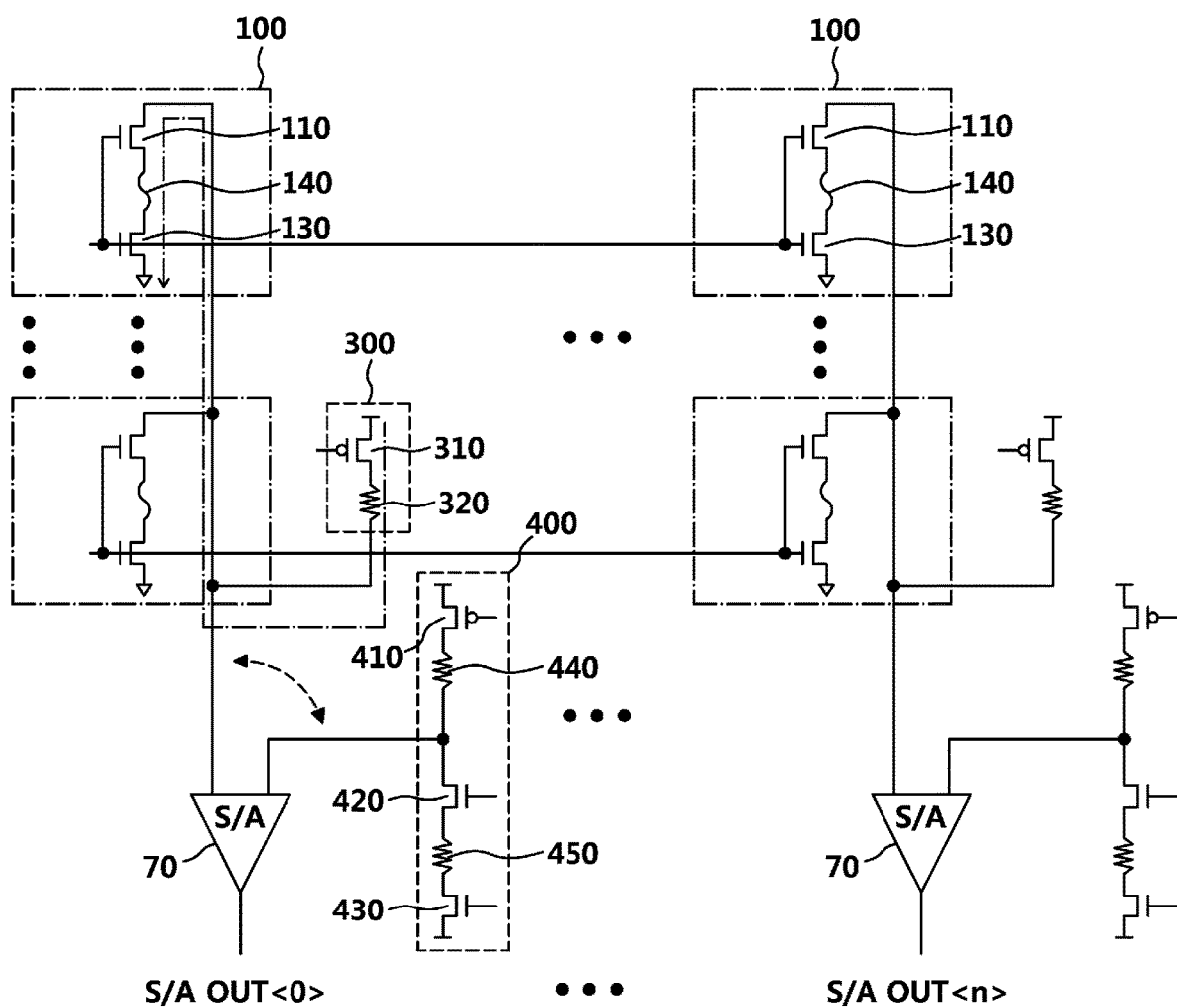
FIG. 5 illustrates a circuit diagram illustrating a read operation of a nonvolatile memory device, according to an example.

FIG. 5 is a circuit diagram illustrating a read operation of the nonvolatile memory device 10, according to an example.

According to the example of FIG. 5, the sense amplifier 70 may compare a voltage applied to the e-fuse 140 with the reference voltage provided by the reference voltage generator 400, and may output the difference. According to the output value of the difference, if the voltage through the e-fuse 140 is smaller than the reference voltage generated by the reference voltage generator 400, it may be judged that the selected e-fuse 140 is not programmed, and in the opposite case, the selected e-fuse 140 may be judged as being programmed. Because the diode 120 is not used for the current path during the read operation of the present example, it is not illustrated in the example of FIG. 5.

In greater detail, the control logic 20 may select the first e-fuse unit cell structure 100 to perform a read operation, and may provide a selection signal to the selected e-fuse unit cell structure 100. Then, the first switching device 110, the second switching device 130 and the read current switching device 310 may be turned on, accordingly. After that, the word line (WL) driver 40 may drive the read current control unit or read current controller 300 by providing a read voltage to generate a reference voltage. Accordingly, the switching devices 310, 410, 420, and 430 may be turned on.

According to the example of FIG. 5, a read current control unit 300 may provide a read voltage to the selected e-fuse unit cell 100 for a read operation. That is, during the read operation of the nonvolatile memory device 10, a read voltage may be provided to the selected e-fuse unit cell 100. The read current control unit 300 may include a read current switching device 310 and a read current resistor 320 formed by using a non-silicided poly-Si layer, according to a non-limiting example. In such an example, the read voltage may ranges from 1-6V. As the read current switching device 310 is turned on, the read current may flow through the read current switching device 310, the read current resistor 320, the first switching device 110, the e-fuse 140, and the second switching device 130.

The read current may also flow through the first reference switching device 410, the first reference resistor 440, and the second reference switching device 420, the second reference resistor 450, and the third reference switching device 430. In such an example, the first and second reference resistors 440 and 450 may correspond to the read current resistor 320 and the e-fuse 140, respectively. The first, second and third reference switching devices 410, 420 and 430 may correspond to the read current switching device 310, the first switching device 110 and the second switching device 130, respectively. The first reference switching device 410 and the corresponding read current switching device 310 may be PMOS devices, such as to minimize mismatching characteristics otherwise occurring during the reading operation. The second and third reference switching devices 420 and 430 and the corresponding first and second switching devices 110 and 130 may be NMOS transistors to minimize mismatching characteristics otherwise occurring during the reading operation. The reference voltage generator 400 may have the three switching devices 410, 420 and 430 and two reference resistors 440 and 450. The e-fuse unit cell 100 and the read current control unit 300 may also include the three switching devices 110, 130 and 310 and two resistors 140 and 320. As a result of using these approaches in examples, mismatching characteristics may be minimized during the reading operation.

Further, if the e-fuse 140 is un-programmed, the e-fuse 140 may show a lower resistance value than the first to second reference resistors 440 and 450, so that a voltage measured at the e-fuse 140 may be lower than the reference voltage generated by the reference voltage generator 400.

Conversely, if the e-fuse 140 is programmed, the e-fuse 140 may show a higher resistance value than a reference resistance, and thus a voltage measured at the e-fuse 140 may be higher than the reference voltage. Accordingly, the sense amplifier 70 may determine whether the e-fuse 140 is programmed by comparing the voltage of the e-fuse with the reference voltage.

According to the example of FIG. 5, the read current switching device 310 may be a P-channel MOS transistor. The read current resistor 320 may have a predetermined first resistance value. In addition, one end of the read current resistor 320 may be connected to a fourth drain terminal of the read current switching device 310. The other end of the read current resistor 320 may be commonly connected to each of the drain terminals of the first switching device 110 in the e-fuse unit cell structure 100, through the bit line 220A. The other end of the read current resistor 320 may also be connected to the bit line sense amplifier 70. The first resistance value of the read current resistor 320 may have an intermediate value about 1600 $\Omega$ between an un-programmed resistance value, that is, 300 $\Omega$ or less, and a minimum resistance value, that is, 3000 $\Omega$ when programmed.

According to the example of FIG. 5, the reference voltage generator 400 may provide a reference voltage to the bit line sense amplifier 70. The reference voltage generator 400 may include three switching devices 410, 420 and 430 and two reference resistors 440 and 450 formed by using a non-silicided poly-Si layer. The reference voltage generator 400 may divide the read voltage using a plurality of resistors connected in series, and may generate the divided voltage as a reference voltage. The three switching devices 410, 420 and 430 may be connected in series. The second reference resistor 440 may be connected between the first reference switching device 410 and the second reference switching device 420, and the second reference resistor 450 may be connected between the second reference switching device 420 and the third reference switching device 430.

According to the example of FIG. 5, the first reference switching device 410 may be a PMOS device. With respect to the first reference switching device 410, its source terminal may receive the read voltage, its gate terminal may receive the inverted read control signal and its drain terminal may be connected to one end of the first reference resistor 440 to selectively provide a read voltage to the first reference resistor 440. The second reference switching device 420 may selectively connect the first reference resistor 440 and the second reference resistor 450. That is, the second reference switching device 420 may be an NMOS having a drain terminal commonly connected to the first reference resistor 440 and the sense amplifier 70, a gate terminal inputted with a read control signal, and a source terminal connected to a second reference resistor 450. The third reference switching device 430 may be an NMOS whose drain terminal is connected to the second reference resistor 450, a gate terminal receives a read control signal, and a source terminal is grounded, such that current flows through the first reference resistor 440 and the second reference resistor 450 due to the read voltage.

According to the example of FIG. 5, two resistors provided in the reference voltage generator 400, that is, the first reference resistor 440 and the second reference resistor 450, may each have a predetermined resistance value, respectively. Each resistance value may have an intermediate value, for example, 1500 to 5000 Ω between the resistance value as not programmed, for example, about 50-200 Ω and the minimum resistance value when programmed, for example, about 3000-10000Ω, of the e-fuse 140.

Figure 6:
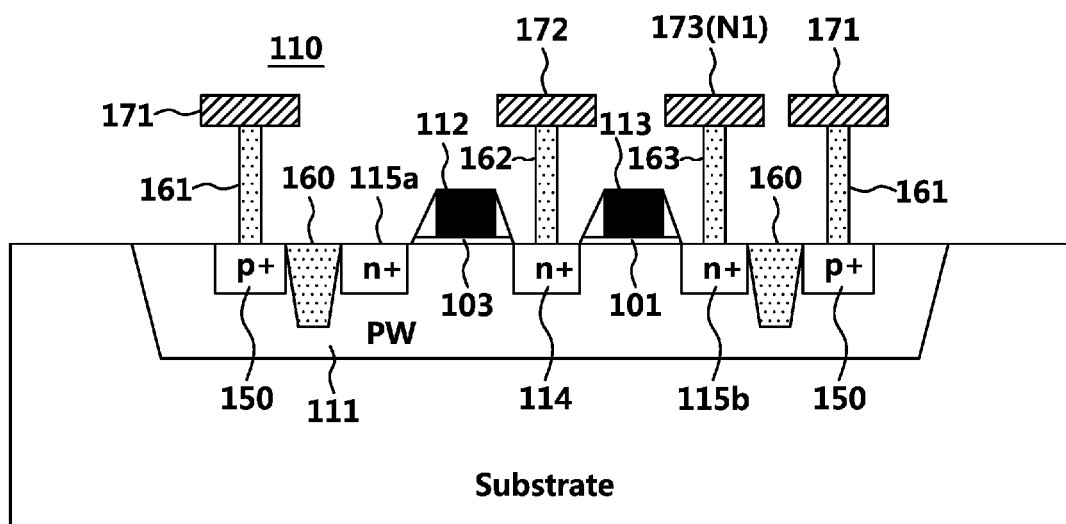
FIG. 6 illustrates a cross-sectional view of a first switching device taken along line I-I' in the e-fuse cell illustrated in FIG. 2, according to an example.

FIG. 6 is a cross-sectional view of the first switching device 110 taken along line I-I' in the e-fuse unit cell structure 100 illustrated in the example of FIG. 2.

A P-type well region (PW) 111 may be formed in a semiconductor substrate. A first switching gate insulating layer 101 and a dummy gate insulating layer 103 may be formed on the semiconductor substrate The first switching gate electrode 113 and the dummy gate electrode 112 may be formed on the first switching gate insulating layer 101 and the dummy gate insulating layer 103, respectively. The floating region 115a, the dummy gate electrode 112, and first switching N+ drain region 114 may be required for a read margin test. For the read margin test, a NMOS transistor may be further required to be in a reference voltage path. To match the NMOS transistor, the NMOS dummy gate electrode 113 with the floating region 115a may be added to the first switching device 110. In one or more non-limiting examples, such elements may be added in parallel or removed. The adding of the NMOS dummy gate electrode 113 with the floating region 115a may be optional, in that one or more examples add the NMOS dummy gate electrode 113 with the floating region 115a, but one or more other examples omit this element.

Spacers may be formed on the sidewalls of the first switching gate electrode 113 and the dummy gate electrode 112. The dummy gate electrode 112 and the first switching gate electrode 113 may be doped by using N-type dopants. A first switching N+ drain region 114 may be formed in the P-type well region (PW) 111 between the dummy gate electrode 112 and the first switching gate electrode 113. The floating region 115a and the first switching N+ drain region 114 may be formed in the P-type well regions 111 at both sides of the dummy gate electrode 112. The first switching N+ source region 115b, the first switching N+ drain region 114, and the floating region 115a may all have the same conductivity type and the same doping concentration and the same depth as each other, because all of these regions may be formed in the same processing step with the same dopant condition. The first switching N+ drain region 114 may be connected to the sense amplifier 70 for performing a read operation. The floating region 115a may not be connected to any potential, so the floating region 115a may remain in a floating state. However, the first switching source region 115b may be connected to the first node N1. In such an example, the first switching N+ drain region 114 and the first switching gate electrode 113 may become parts that form a read current path during a read operation. In the present discussion, the use of "N+" refers to highly doped N-type dopants. "P+" refers to highly doped P-type dopants.

Further, a P+ guard ring 150 may be formed in the P-type well region 111 and may be spaced apart from the first switching N+ source region 115a and the first switching N+ source region 115b by a first isolation structure 160. The P+ guard ring 150 may electrically isolate the first switching device 110 from the other devices. In addition, the trench-type first isolation structure 160 adjacent to the guard ring 150 may be formed, in one or more non-limiting examples. Further, there may be many contact plugs 161, 162, 163 and metal interconnections 171, 172, 173. The guard ring 150 may be connected to the contact plug 161 and the metal line 171. The N+ drain region 114 may be connected to the contact plug 162 and metal line 172. The source region 115b may be connected to another contact plug 163 and another metal line 173. In such an example, the metal line 173 may indicate the first node N1 as shown in the example of FIG. 3.

Figure 7A:
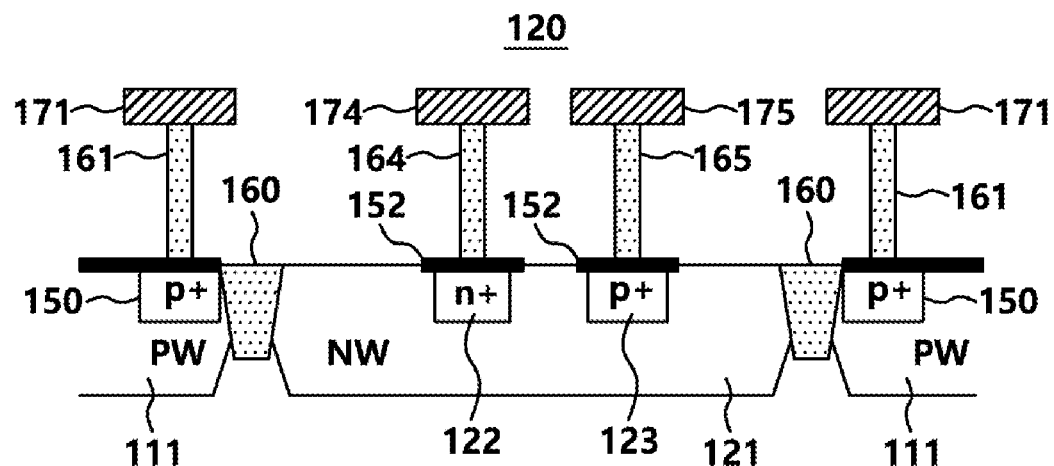
FIGS. 7A and 7B are cross-sectional views of a diode structure taken along line II-II' in the e-fuse cell illustrated in FIG. 2, according to an example.
Figure 7B:
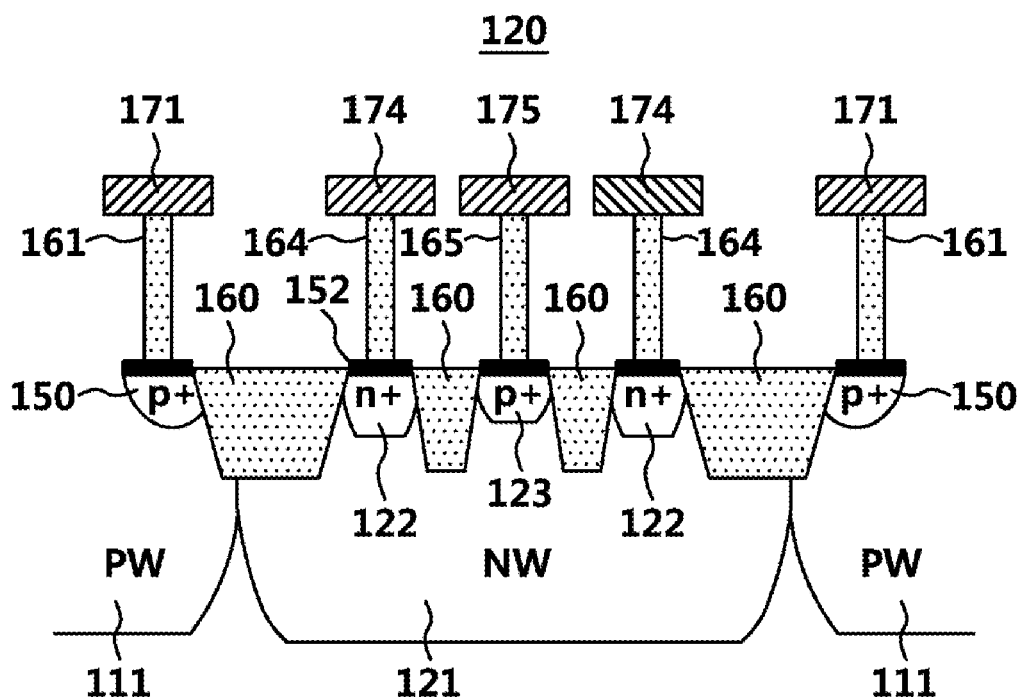

FIGS. 7A and 7B are cross-sectional views of the diode structure 120 taken along the line II-II' in the e-fuse cell illustrated in FIG. 2, according to an example.

As illustrated in the example of FIG. 7A, an N-type well (NW) region 121 may be formed in a semiconductor substrate. An N+ cathode 122 and a P+ anode 123 may be formed in the N-type well region (NW) 121. The NW 121 may be isolated from the P-type well region (PW) 111 by a trench isolation region 160. The trench isolation region 160 may surround the N-type well region (NW) 121. A P+ guard ring 150 may also be formed in the P-type well region (PW) 111, in one or more examples. Further, silicide layers 152 may also be formed on the N+ cathode and the P+ anode. Contact plugs 164, 165 may be formed on the silicide layers 152, and metal interconnections 174, 175 may be formed to couple the contact plugs 164 and 165 to each other. The N+ cathode 122 may be connected to the contact plug 164 and the metal line 174. The P+ anode 123 may be connected to the contact plug 165 and metal line 175.

FIG. 7B is a cross-sectional view of a diode 120 of another example. A P+ anode 123 may be formed in an N-type well region 121, and the first isolation structure 160 may enclose the P+ anode 123. An N+ cathode 122 may be formed to be adjacent to the isolation structure 160. Unlike the example of FIG. 7A, the diode 120 of the example of FIG. 7B may have an isolation structure 160 formed between the P+ anode 123 and the N+ cathode 122. Because of the presence of the isolation structure 16, the N+ cathode 122 and the P+ cathode region 123 may be effectively isolated from each other, thereby reducing the size of the overall device. If a diode is configured without the isolation structure 160, as in the example of FIG. 7A, the size of the overall device may be much larger, to improve the junction breakdown voltage as in the example of FIG. 7B. In the same manner, as explained in the example of FIG. 7A, there may also be silicide layers 152, contact plugs, and metal lines, as shown in the example of FIG. 7B.

Figure 8:
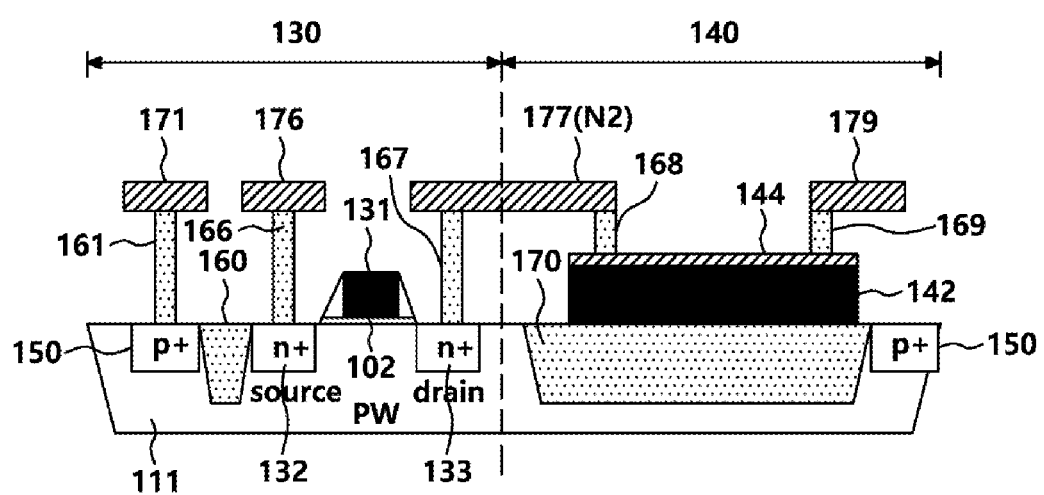
FIG. 8 illustrates a cross-sectional view of the second switching device and the e-fuse taken along the line III'-III' in the e-fuse cell of FIG. 2, according to an example.

FIG. 8 is a cross-sectional view taken along line III-III' of the second switching device 130 and the e-fuse 140 provided in the e-fuse unit cell structure 100, as illustrated in the example of FIG. 2.

According to the example of FIG. 8, the second switching device 130 and the e-fuse 140 may be formed together in the P-type well region 111. In FIG. 8, the left side of the drawing is the second switching device 130 and the right side is the e-fuse 140. In the second switching device 130, a second switching gate electrode 131 may be formed on a second gate insulating layer 102. A second spacer may be formed on sidewalls of the second switching gate electrode 131. The second switching N+ source region 132 and the second switching second switching N+ drain region 133 may formed in the P-type well region 111, on both sides of the second switching gate electrode 131. The second switching N+ source region 132 may be grounded, and the second switching second switching N+ drain region 133 may be connected to the anode of the e-fuse 140. The second switching second switching N+ drain region 133 is connected to the third switching device 210, together with the anode of the e-fuse 140. The P+ guard ring 150 may be formed to be spaced apart from the second switching N+ source region 132. The trench-type isolation structure 160 may be formed between the guard ring 150 and the second switching N+ source region 132.

According to the example of FIG. 8, the e-fuse 140 may use a poly-fuse including a silicide layer 144, formed on the pol-Si material 142. The silicide layer 144 may selected from one of cobalt silicide, nickel silicide or titanium silicide, as non-limiting examples, but other silicide materials may be used for the silicide layer 144 in other examples. The e-fuse 140 formed adjacent to the second switching device 130 may have an anode contact plug 168 and a cathode contact plug 169. Each of the anode contact plug 168 and the cathode contact plug 169 may be formed by using a metal layer, such as tungsten metal, as a non-limiting example, which may be electrically coupled to both of the poly-Si layer 142 and the silicide layer 144. Thus, the anode contact plug 168 and the cathode contact plug 169 may be connected to metal layers, or metal lines or metal interconnections, 177 and 179, respectively, which may be selected from one of the materials of aluminum-copper (Al—Cu), tungsten (W), or copper (Cu), and so on, as non-limiting examples. The metal line 177 may connect between the anode contact plug 168 of the e-fuse 140 and second switching contact plug 167 of the second switching device 130. Thus, the e-fuse 140 may be electrically connected to the second switching 130 by the metal line 177. In such an example, the metal line 177 may indicate the second node N2, as shown in the example of FIG. 3.

According to the example of FIG. 8, a second isolation structure or e-fuse isolation structure 170 having a predetermined depth may be formed in the p-well region 111 located at the lower part of the poly-Si layer 142. The e-fuse isolation structure 170 may have a length longer than a length of the e-fuse 140 and may have a depth deeper than a depth of the second switching N+ source region 132 or the second switching second switching N+ drain region 133. A P-type guard ring 150 may be formed adjacent to the e-fuse isolation structure 170.

Next, a current flow direction during a program operation and a read operation of a nonvolatile memory device, according to an example, is described in greater detail. The description of the current flow refers to the example of FIG. 9, in which the first switching device 110, the second switching device 130, the diode 120, and the e-fuse 140 may be connected to each other.

Figure 9:
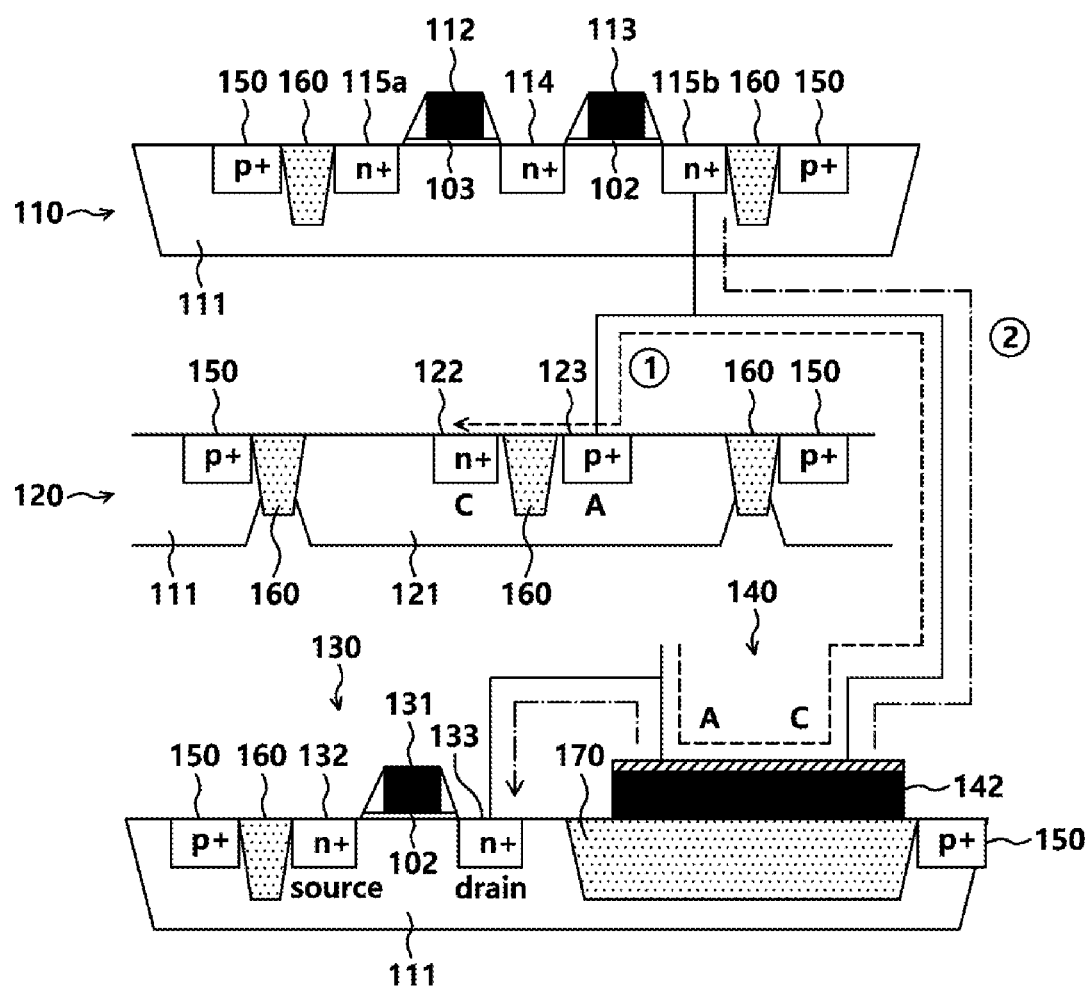
FIG. 9 illustrates a diagram in which the devices of the e-fuse cell are disposed in a vertical direction, according to an example.

FIG. 9 illustrates each device arranged in a vertical direction for convenience of description, but it should be noted that the devices are disposed on one semiconductor substrate as illustrated in the example of FIG. 2 or the example of FIG. 3.

In such a configuration, during the program operation, the first and second switching devices 110 and 130 may be turned OFF. To program the e-fuse 140, the program current may flow into the e-fuse 140. Arrow (①) indicates the program current path. The program current may flow into the e-fuse 140 and may flow out the diode 120, according to arrow ①. Thus, the e-fuse 140 may be programed and then the resistance of e-fuse 140 may be increased because the silicide layer may be agglomerated on the poly-Si layer.

On the other hand, during the read operation, the first and second switching devices 110 and 130 may be turned ON. Arrow ② indicates a read current path. The read current may flow starting from the first switching device 110 and the read current may flow through the e-fuse, and may finally flows out of the second switching device 130. In greater detail, the current flow may pass from the first switching N+ source region 115b of the first switching device to the second switching N+ drain region 133 of the second switching device 130, via the cathode and anode of the e-fuse 140.

That is, it may be understood that the program operation of the nonvolatile memory device 10 of the example of FIG. 9 may flow through the diode 120, while the read operation may not flow through the diode 120, thereby providing different current flows for these differing operations. As described above, the current directions in the read and program operations may be opposite to each other, and thus the read operation, as indicated by arrow ②, may not need to flow through the diode 120, thereby enabling operation at a low voltage.

Figure 10:
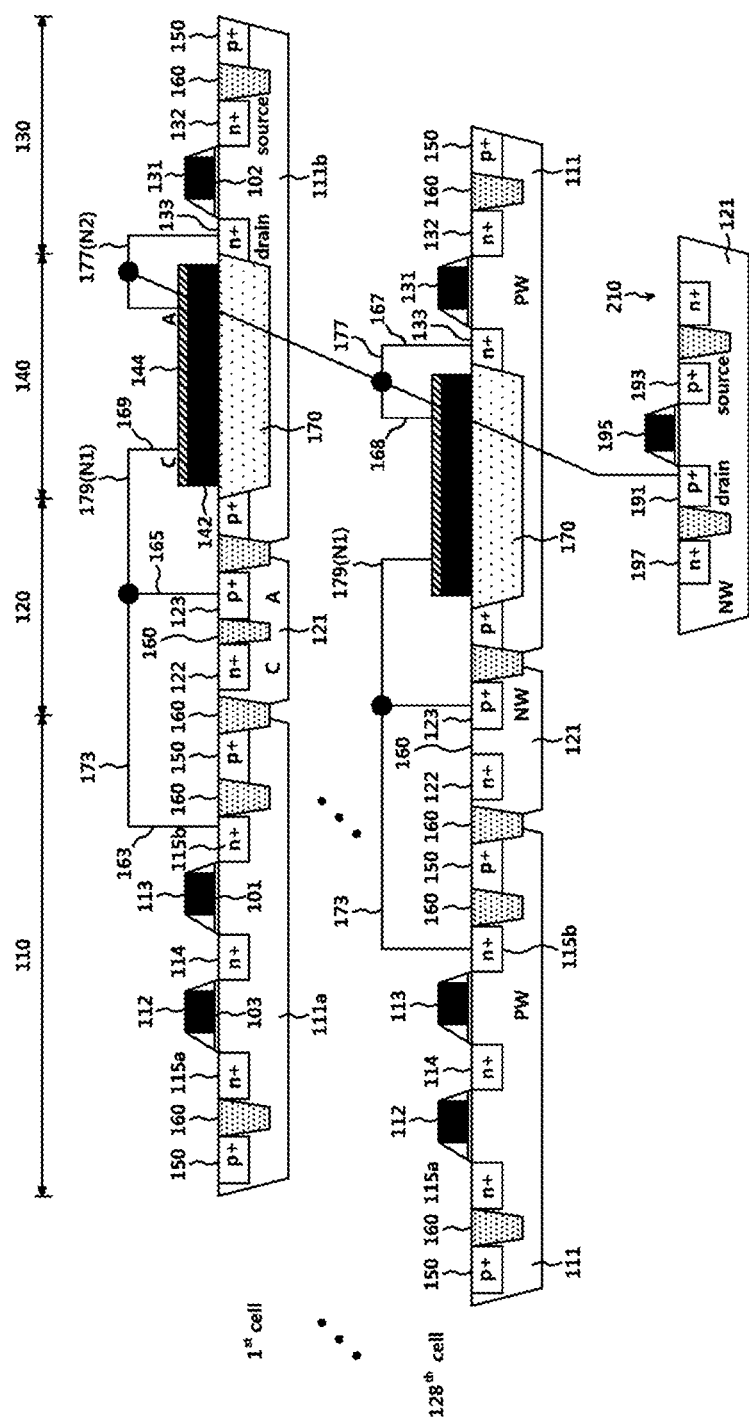
FIG. 10 illustrates a cross-sectional view of the e-fuse cell structure taken along the line IV-IV' in FIG. 2, according to an example.

FIG. 10 is a cross-sectional view of the e-fuse unit cell structure 100 taken along line IV-IV', in the example of FIG. 2.

The second switching device 130, at left, and the e-fuse 140, at right, may be arranged side by side in the example of FIG. 2. However, the positions of the second switching device 130 and the e-fuse 140 are changed in FIG. 10, that is, the e-fuse 140, at left, and the second switching device 130, at right, are positioned as shown. In order to sufficiently explain the longitudinal cross-sectional structure of the e-fuse unit cell structure 100, the location of each device may be rearranged.

As illustrated in the example of FIG. 10, the first switching device 110, the diode 120, the e-fuse 140 and the second switching device 130 may be sequentially connected from the left side of the drawing to configure the e-fuse unit cell structure 100, as shown. In the present example, a plurality of e-fuse unit cells 100 may be provided in the row direction. The number of the e-fuse cells, for example, may be 128. The third switching device 210 in the program current control unit 200 may be connected to the anode of the e-fuse 140 of each cell 100.

As illustrated in the example of FIG. 10, a semiconductor device, according to a non-limiting example, may include a first contact plug 163 formed on first switching device 110, a second contact plug 165 formed on the diode 120, a third contact plug 169 formed on the e-fuse 140, and a first metal interconnection 173, 179 connecting the first contact plug 163, the second contact plug 165 and the third contact plug 169. The first metal interconnection 173, 179 may indicates the first node N1, as shown in the example of FIG. 3.

As illustrated in the example of FIG. 10, a semiconductor device according to an example may further include a fourth contact plug 168 formed on anode of the e-fuse 140, a fifth contact plug 167 formed on the N+ drain region 133 of the second switching device 130, and a second metal interconnection 177 connecting the fourth contact plug 168 and the fifth contact plug 167. The second metal interconnection 177 may refer to the second node N2, as shown in the example of FIG. 3.

The first switching device 110 may be formed on a first well region, such as P-type well region, PW 111a and the diode 120 may be formed on a second well region, such as N-type well region, NW 121 having a opposite conductivity type to that of the first well region 111a, and the second switching device 130 may be formed on a third well region, such as P-type well region, PW111b, having a same conductivity type as that of the first well region 111a. A guard ring 150 to enclose the first switching device 110, the diode 120, the e-fuse 140 and the second switching device 130 may be present, as well. The first switching device 110 and the second switching device 130 may be NMOS transistors.

As illustrated in the example of FIG. 10, for the program operation, the third switching device 210 may be connected to the anode of e-fuse 140. The program current may flow from the third switching device or PMOS transistor 210 into the anode of e-fuse 140. Then, the e-fuse 140 may be programed and the program current may flows out through the diode 120, including a P+ anode and an N+ cathode. During the program operation, the first switching device 110 and the second switching device 130 may be turned-off. The third switching device or PMOS transistor 210 may include a third switching P+ drain region 191, a third switching P+ source region 193, and a third switching gate electrode 195 between the P+ drain/source regions 191, 193. In such an example, the third switching P+ drain region 191 and the third switching P+ source region 193 may be formed in N-type well region 121. Thus, the third switching P+ drain region 191 of the third switching device or PMOS transistor 210 may be electrically connected to the anode of the e-fuse.

For the read operation, the read current may flow into the first switching device 110 and through the e-fuse 140 and may finally flow out of the second switching device 130. The metal lines 173, 179 or N1, and 177 or N2, may be used for the read current path. Thus, the read current path, which may be left to right, may be opposite to that of the program current path, which may be right to left. As shown in the example of FIG. 3, the read word line 240B may turn on both the first switching device 110 and the second switching device 130 for the read operation.

As described above, it may be seen that the present disclosure performs the program and read operations using different current paths during the program operation and the read operation of the nonvolatile memory device 10. In this example, the program voltage may require 5.5V for the path through the e-fuse and diode during the program operation, but the voltage level may be adjusted to 1.6-5.5V for the path through only the e-fuse and the first and second switching devices, during the read operation.

Also, when the nonvolatile memory device 10 is arranged to form a diode-type e-fuse cell as in the present examples, it may be possible to provide a design that may reduce the area of the nonvolatile memory device 10. Such reduction of area may cause the nonvolatile memory device 10 to be suitable for other applications. That is, for example, when the area of an e-fuse cell based on a 2K bit transistor and that of an e-fuse cell based on a 2K bit diode as in the present disclosure are tested, the area of the present disclosure may be 2.8E7 $\mu m^2$, while the transistor based e-fuse cell may be 5.0E7 $\mu m^2$, which is a significant reduction in the size of the area.

As described above, the e-fuse cell of the present disclosure may be manufactured into a diode type employing a diode as a program selection device while appropriately disposing devices provided therein, thereby reducing the area of the existing e-fuse cell. Such an approach may also be expected to reduce the size of the memory device employing the e-fuse cell.

In addition, because the current paths of the program operation and the read operation of the e-fuse cell may be set differently, a stable operation with a lower current may be possible.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
    an e-fuse formed on an insulation layer;
    a first switching device formed on a first well region;
    a diode formed on a second well region having a opposite conductivity type to a conductivity type of the first well region; and
    a second switching device formed on a third well region having a same conductivity type as the conductivity type of the first well region.

2. The semiconductor device of claim 1, further comprising:
    a guard ring that encloses the first switching device, the diode, the e-fuse and the second switching device.

3. The semiconductor device of claim 1, wherein the first switching device and the second switching device comprise n-type metal-oxide-semiconductor (NMOS) transistors.

4. The semiconductor device of claim 1, further comprising:
    a first contact plug formed on the first switching device;
    a second contact plug formed on the diode;
    a third contact plug and a fourth contact plug formed on the e-fuse; and
    a fifth contact plug formed on the second switching device.

5. The semiconductor device of claim 1, further comprising:
    a first metal interconnection connecting the first contact plug, the second contact plug and the third contact plug; and a second metal interconnection connecting the fourth contact plug and the fifth contact plug.

6. A semiconductor device comprising:
an e-fuse formed on an insulation layer;
a first switching device formed on a first well region;
a diode formed on a second well region; and
a second switching device formed on a third well region.

7. The semiconductor device of claim 6, wherein the second well region has an opposite conductivity type to a conductivity type of the first well region.

8. The semiconductor device of claim 6, wherein the third well region has a same conductivity type as a conductivity type of the first well region.

9. The semiconductor device of claim 6, further comprising:
a guard ring that encloses the first switching device, the diode, the e-fuse and the second switching device.

10. The semiconductor device of claim 6, wherein the first switching device and the second switching device comprise n-type metal-oxide-semiconductor (NMOS) transistors.

* * * * *